United States Patent
Gajewski et al.

(10) Patent No.: US 10,684,329 B2
(45) Date of Patent: Jun. 16, 2020

(54) METHOD FOR ESTIMATING THE AGEING OF A BATTERY

(71) Applicants: AIRBUS DEFENCE AND SPACE SAS, Toulouse (FR); CENTRE NATIONAL D'ETUDES SPATIALES CNES, Paris (FR)

(72) Inventors: Laurent Gajewski, Quint Fonsegrives (FR); Pierre-Louis Taberna, Escalquens (FR); Patrice Simon, Toulouse (FR)

(73) Assignees: AIRBUS DEFENCE AND SPACE SAS, Toulouse (FR); CENTRE NATIONAL D'ETUDES SPATIALES CNES, Paris (FR)

( * ) Notice: Subject to any disclaimer, the term of this patent is extended or adjusted under 35 U.S.C. 154(b) by 922 days.

(21) Appl. No.: 14/404,616

(22) PCT Filed: Aug. 9, 2013

(86) PCT No.: PCT/EP2013/066761
§ 371 (c)(1),
(2) Date: May 2, 2015

(87) PCT Pub. No.: WO2014/029647
PCT Pub. Date: Feb. 27, 2014

(65) Prior Publication Data
US 2015/0226812 A1 Aug. 13, 2015

(30) Foreign Application Priority Data
Aug. 21, 2012 (FR) .................................. 12 02266

(51) Int. Cl.
*G01R 31/392* (2019.01)
*G01R 31/3842* (2019.01)
(Continued)

(52) U.S. Cl.
CPC ......... *G01R 31/392* (2019.01); *G01R 31/389* (2019.01); *G01R 31/3842* (2019.01); *G06F 30/20* (2020.01)

(58) Field of Classification Search
None
See application file for complete search history.

(56) References Cited

U.S. PATENT DOCUMENTS

| 4,678,998 A | 7/1987 | Muramatsu | |
|---|---|---|---|
| 2004/0128089 A1* | 7/2004 | Barsoukov | G01R 31/3662 702/65 |
| 2008/0048662 A1* | 2/2008 | Hirsch | G01R 31/3662 324/430 |

FOREIGN PATENT DOCUMENTS

| EP | 1298444 A1 | 4/2003 |
|---|---|---|
| EP | 1892536 A1 | 2/2008 |

(Continued)

OTHER PUBLICATIONS

Doyle, Marc, Jeremy P. Meyers, and John Newman. "Computer simulations of the impedance response of lithium rechargeable batteries." Journal of the Electrochemical Society 147.1 (2000): 99-110.*

(Continued)

*Primary Examiner* — Bijan Mapar
(74) *Attorney, Agent, or Firm* — Im IP Law; Chai Im; C. Andrew Im

(57) ABSTRACT

A method for estimating the ageing of a battery powering an electrical system. A set of data about the voltage and current across the battery terminals, in response to the current perturbations provoked during the normal operation of the battery by the changes of consumption rate of the electrical system are stored. The impedance of the battery, within a predetermined frequency interval, from the voltage and current data is determined. The age of the battery as a (Continued)

function of the impedance is estimated by comparing the impedance with a previously stored model of evolution of this impedance with ageing.

12 Claims, 5 Drawing Sheets

(51) Int. Cl.
*G01R 31/389* (2019.01)
*G06F 30/20* (2020.01)

(56) References Cited

FOREIGN PATENT DOCUMENTS

| | | |
|---|---|---|
| EP | 2375487 A1 | 10/2011 |
| WO | 99/66340 A1 | 12/1999 |

OTHER PUBLICATIONS

Wiegman, Herman LN, and R. D. Lorenz. "High efficiency battery state control and power capability prediction." 15th Electric Vehicle Symposium. vol. 15. 1998.*

Broussely, M., et al. "Lithium ion: the next generation of long life batteries characteristics, life predictions, and integration into telecommunication systems." Telecommunications Energy Conference, 2000. INTELEC. Twenty-second International. IEEE, 2000.*

Saha, B., Poll, S., Goebel, K., & Christophersen, J. (Sep. 2007). An integrated approach to battery health monitoring using Bayesian regression and state estimation. In autotestcon, 2007 IEEE (pp. 646-653). Ieee. (Year: 2007).*

Zhang, J., & Lee, J. (2011). A review on prognostics and health monitoring of Li-ion battery. Journal of Power Sources, 196(15), 6007-6014. (Year: 2011).*

* cited by examiner

METHOD FOR ESTIMATING THE AGEING OF A BATTERY

RELATED APPLICATIONS

This application is a § 371 application from PCT/EP2013/066761 filed Aug. 9, 2013, which claims priority from French Patent Application No. 12 02266 filed Aug. 21, 2012, each of which is herein incorporated by reference in its entirety.

TECHNICAL FIELD OF THE INVENTION

The present invention lies within the field of test devices and methods.

It more particularly concerns a method for diagnosing the ageing of a battery.

BACKGROUND OF THE INVENTION

The problem of determining the ageing of a battery has many applications, particularly in the context of batteries installed on board satellites. In such cases, knowing the state of the battery is crucial when it comes to determining the end of the satellite lifetime. In the absence of precise knowledge about the state of ageing of the battery, the satellite is prematurely deactivated, thus generating a significant operating loss.

The behavior of a battery as a function of its ageing is illustrated by FIG. 1, which shows the depth of discharge of the battery (separation between the maximum charge and the minimum charge of the battery) on the abscissa, and the voltage across the battery terminals on the ordinate. As can be seen in FIG. 1, for a battery at the beginning of its life (curve 1), the available discharge depth is maximal, and the curve of voltage supplied by the battery is substantially flat until the maximum discharge depth is almost reached, when there is a rapid drop in voltage. For a battery at the end of its life (curve 2), the situation is identical, with a plateau at a slightly lower battery voltage in normal operation, and a rapid drop in voltage in the vicinity of the discharge depth.

Curve 3 (in dotted lines in FIG. 1), corresponding to a battery of any age, is found, on this graph, between the two preceding curves. The simple measurement of the voltage observed on the plateau at the start of the battery use (left-hand part of the curve) does not suffice to accurately characterize the ageing of the battery. This thus results in a great deal of uncertainty regarding the time of the rapid drop in voltage of the battery.

The usual methods for determining the ageing of a battery comprise the measurement of its internal resistance and of the loss of capacity of the battery (drop in the discharge depth). The capacity measurement is based on a complete discharge of the battery at constant current.

These parameters of capacity and internal resistance are therefore not accessible for embedded equipment, on board a satellite for example. Moreover, a complete discharge of battery on board a satellite would lead to the loss of the latter, and this solution is therefore not envisionable.

Methods for diagnosing the ageing of a battery suitable for embedded equipment are moreover known.

Patent application US 2012/0019253 A1 "Method for determining an aging condition of a battery cell by means of impedance spectroscopy" describes a diagnostic method based on the comparison between a low-frequency impedance of the real battery, and a threshold impedance, characteristic of a battery at the end of its life.

The low-frequency impedance measurement of the battery is here performed by measuring the voltage of the battery, when the latter undergoes the injection of a current including sinusoidal variations of variable frequency (impedance spectroscopy method).

The method is applicable to various types of battery: Li-Ion, Li-Polymer, NiCd, NiMH, etc.

Similarly, the publication "Impedance Noise Identification for State-of-Health Prognostics" (INL/CON-08-14101, 43$^{rd}$ Power Sources Conference, July 2008) describes an ageing diagnosis method using an impedance measurement of the battery, here based on the injection of a random current (white noise and pink noise) into the battery. The method then uses FFT (Fast Fourier Transform) processing to determine the impedance of the battery. Here again, this measured impedance is compared to reference values.

In this field a document EP 1 892 536 A1 is known relating to the analysis of the ageing of a lead-type battery, such as used in a motor vehicle in particular. This document describes a system for computing an impedance spectrum using a measurement performed during the ignition pulses (high-frequency pulses that are reliable and required to be reproducible), and if necessary completed by test pulses using controllable charging dedicated to this effect. This document mentions the limits of a model using only one ignition pulse as data source, and introduces controllable charging intended for measurements with a test pulse. These test charges can be part of the normal electrical equipment of the vehicle, but they are driven to generate pulses at the moment of the ageing measurement. The measurement therefore takes place either at the time of the ignition pulse, or during test pulses.

A patent document U.S. Pat. No. 4,678,998 is also known, also relating to the accurate measurement of ageing of a lead-acid battery of a motor vehicle. This document mentions that the various loads connected to the battery will produce frequency components with different voltages and currents on the battery. This document describes a device wherein the voltage and the voltage across the terminals of a motor vehicle battery are constantly measured, and impedance measurements are computed at the various frequencies associated with the loads connected to the battery. Finally, the system compares its measurement results to pre-stored curves for each of the frequencies associated with the operation of the loads.

Another document EP 2 375 487 is known relating to a method of identification of a model representing the ageing of a battery, using a sequence (M-sequence) injected into the battery. This is clearly apparent in the text, particularly § 10. D3 describes a step of selecting a model of evolution of the impedance, and mentions an ARX model as an example.

OBJECT AND SUMMARY OF THE INVENTION

The invention pertains, firstly, to a method for estimating the ageing of a battery powering an electrical system, characterized in that it includes:

100—a step of storing a set of data about the voltage and current across the battery terminals, in response to the current perturbations provoked during the normal operation of the battery by the changes of consumption rate of the electrical system, 200—a step of determining the impedance of the battery, within a predetermined frequency interval, from the voltage and current data, 300—a step of estimating the age of the battery as a function of the impedance determined in the preceding step, by comparing said impedance with a previously stored model of evolution of this impedance with ageing.

The ageing of a battery mainly translates into a loss of capacity and an increase in its internal resistance.

The current perturbations are induced here by the changes of consumption rate of the system, of which the battery to be tested is a part, during the operational functioning of the system. Usually, in the prior art, the impedances are determined by injecting perturbations of sine type at various frequencies (wobulation) on the current and measuring the resulting voltage.

In the invention, it is no longer necessary to inject current of predetermined form across the battery terminals to test the ageing thereof. This arrangement obviates the need to carry current-generating equipment intended for this test.

The impedance measurement is made solely using the system for acquiring the telemetry of the battery current and voltage. The diagnosis of the battery can therefore be performed throughout the life of the battery, without modification of the system, without injection of perturbations, and can be carried out when the system in which the battery is embedded is operating normally.

Due to the use of current and voltage data telemetry measured across the battery terminals during the normal operation of the battery, it is possible to determine, for the equipment for which these data are constantly stored, the state of ageing of the battery throughout the life of the battery. It is also possible afterwards to determine its ageing profile during its normal functioning.

The impedance is determined here by its magnitude and/or its phase.

In some systems, the electrical power supply can be provided simultaneously by the battery and another power source. For example, on a satellite, this other power source is the solar generator. This makes it possible to increase the power available when the power of the solar generator is insufficient. It is preferable to take measurements when the solar generator is not supplying any current, which is the case during eclipses. In this mode of implementation, step 100 is performed when the electrical system is powered by the battery only.

According to a particular mode of implementation, when the battery is of Li-Ion type, the predetermined frequency interval is in the 0.01-3 Hz band. This frequency interval has been determined by the Applicant as highlighting the maximum offsets of magnitude or phase of the complex impedance of the battery, for a battery of Li-Ion type, during the ageing of the battery. An observation of the impedance spectrum within this interval therefore makes it possible to best determine the age of the battery.

To determine the low-frequency impedance of the battery from the voltage and current data, the method for estimating the ageing of a battery advantageously includes:

210—a sub-step of identifying the parameters of a predetermined model structure from the measured voltage and current data, 220—a sub-step of converting the identified model into the frequency domain, 230—finally a sub-step of computing the low-frequency impedance of the battery.

In a particular embodiment, the model structure is chosen from among the following models: ARMAX, ARX, Box Jenkins, Output Error.

These known models allow a simple implementation of the method according to the invention.

In a particular implementation of the method, the latter includes a step of correcting the computed impedance, to take account of the temperature of the environment of the battery.

Secondly, the invention pertains to a device for estimating the ageing of a battery, suitable for implementing a method as disclosed.

In another aspect, the invention pertains to a satellite, comprising a device as disclosed above.

In yet another aspect, the invention pertains to a computer program product implementing a method as disclosed.

BRIEF DESCRIPTION OF THE DRAWINGS

The features and advantages of the invention will be better appreciated owing to the following description, a description that discloses the features of the invention by way of a non-limiting exemplary application.

The description is based on the appended figures, which represent.

DETAILED DESCRIPTION OF AN EMBODIMENT OF THE INVENTION

Here a battery of Lithium-Ion type will be considered, undergoing a series of charge/discharge cycles. This is for example the case of a battery embedded on board a satellite, and which must supply electrical power whenever the satellite moves into the shadow of the Earth.

Figure 1:
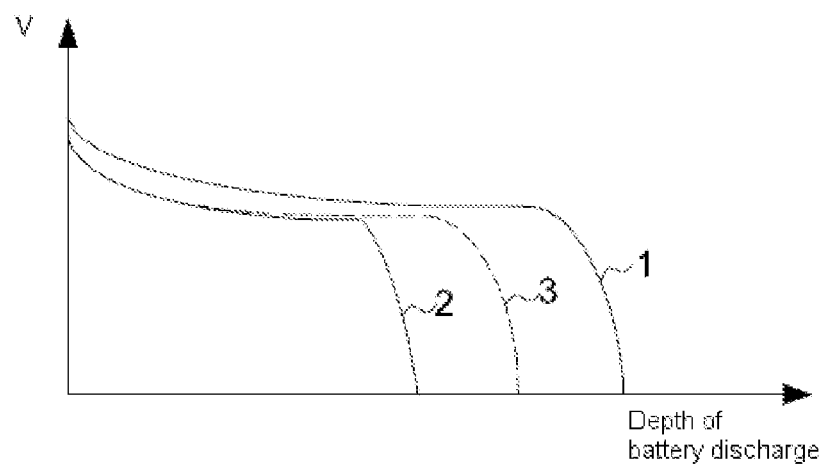
FIG. 1: (already mentioned): a family of curves illustrating, for various battery ages, the fall in voltage in a battery according to the depth of discharge reached.
Figure 2:
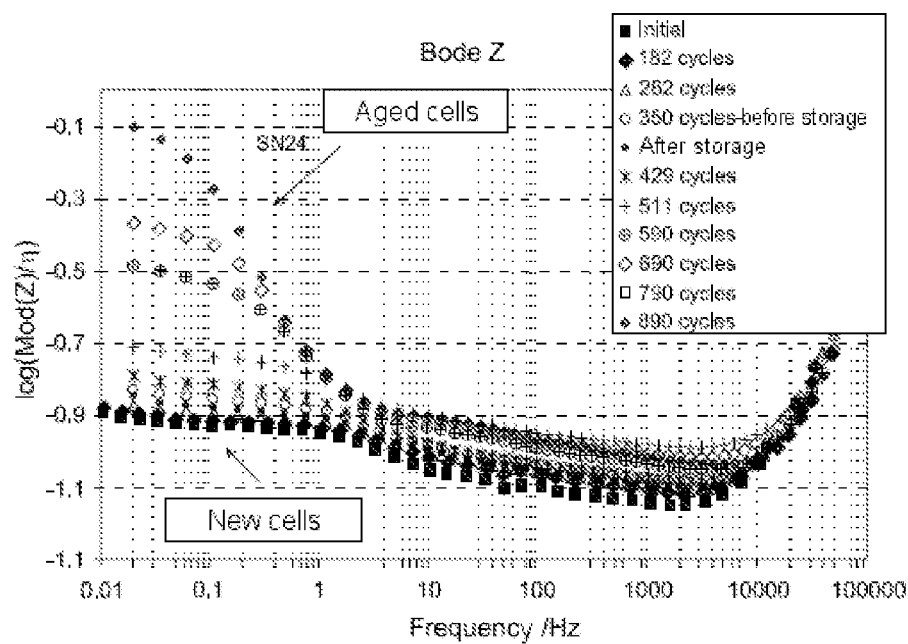
FIG. 2: a family of curves illustrating, for various numbers of use cycles of a battery, the variation of the magnitude of the impedance as a function of the frequency.
Figure 3:
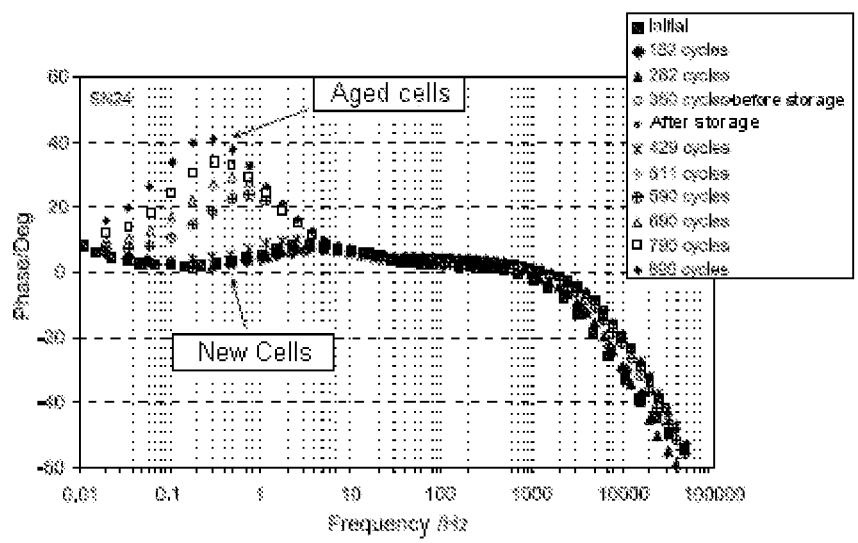
FIG. 3: a family of curves illustrating, for various numbers of use cycles of a battery, the variation of the phase of the impedance as a function of the frequency.

The Applicant has determined curves of impedance variation of a low-frequency battery (typically between 0.01 Hz and 10 Hz) with the number of use cycles of said battery (see FIGS. 2 and 3). FIG. 2 illustrates the variation of the magnitude of the impedance as a function of the frequency, and the evolution of this curve according to the number of operating cycles of the battery. Similarly, FIG. 3 illustrates the variation of the phase of the impedance as a function of the frequency, and the evolution of this curve according to the number of operating cycles of the battery.

On both these families of curves significant offsets are noticed between the values measured for an "aged" battery (for example above 600 use cycles) and a new battery.

Generally, the magnitude and the phase of the impedance increase with the ageing of the battery.

These families of curves allow the production of charts expressing the value of the impedance magnitude or the impedance phase as a function of the number of cycles, at a given frequency, for example 0.3 to 1 Hz (values giving a maximum phase offset between aged and new cells) or 0.02 Hz (value giving, in the present example, a maximum offset of impedance magnitude between aged and new cells).

Based on such charts, a low-frequency impedance measurement of a Lithium-Ion battery used under real conditions, said real battery being of a similar type to the battery used to generate the charts, makes it possible to determine its level of ageing.

Figure 4:
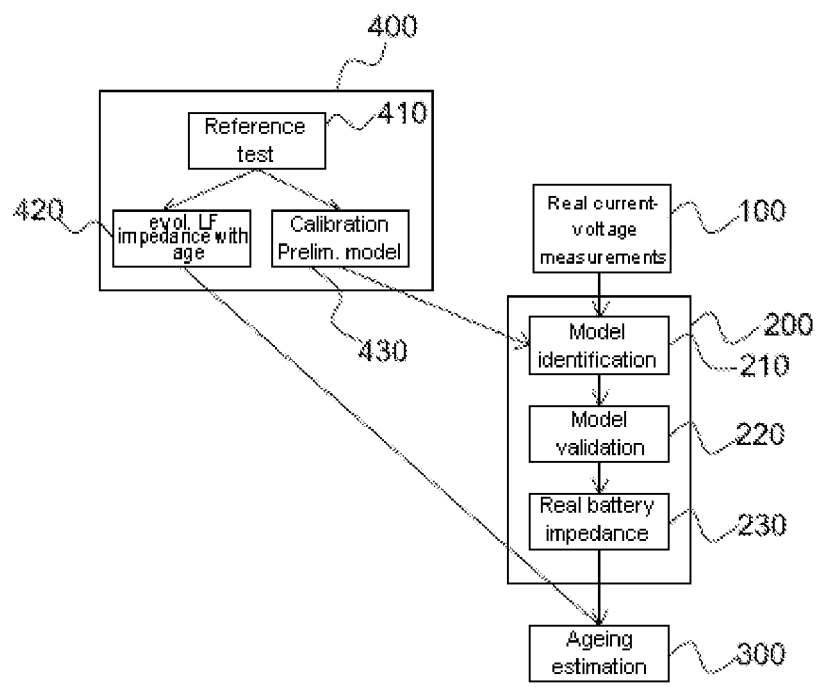
FIG. 4: a flowchart of the steps of an exemplary implementation of the method for estimating battery ageing.

FIG. 4 then illustrates more accurately the steps of the method, in an exemplary implementation, applied here to the estimation of the ageing of a battery embedded on board a satellite. The method is however applicable to any type of battery, for example a telephone or a portable computer battery.

As can be seen in this FIG. 4, the method includes the following steps:

100—a step of storing a set of data about the voltage and current across the battery terminals, in response to the current perturbations provoked during the normal operation of the battery by the changes of consumption rate of the electronic system, 200—a step of determining the impedance of the battery, within a predetermined frequency interval, from the voltage and current data, 300—a step of estimating the age of the battery as a function of the low-frequency impedance measured, by comparing said impedance with a previously stored model for example in the form of charts of the evolution of this impedance with ageing.

Figure 5:
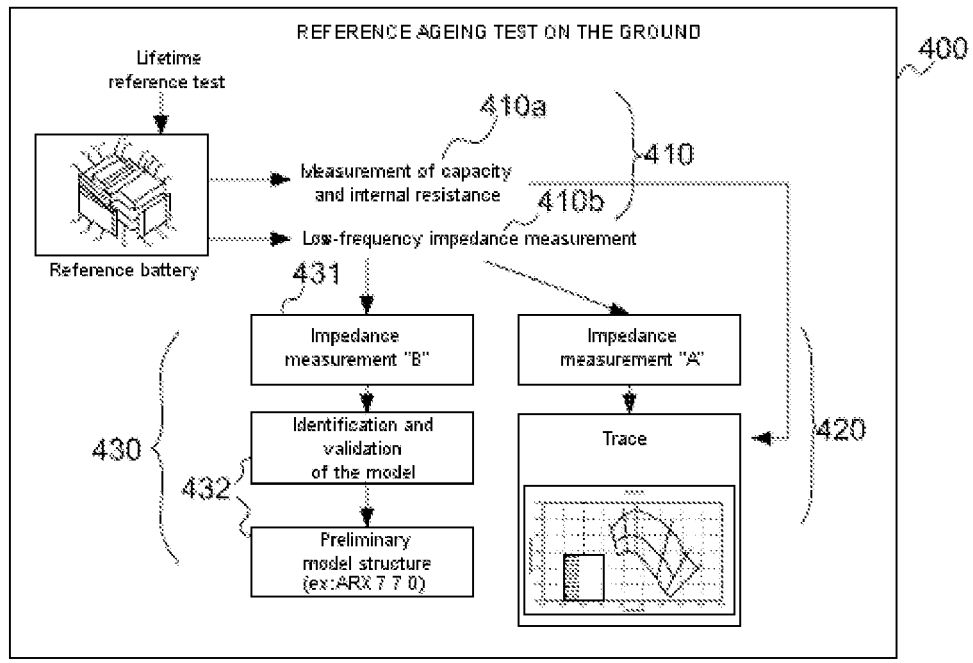
FIG. 5: a flowchart of a detail of the step of battery ageing reference testing.

In a non-limiting exemplary implementation of the method, this model of evolution is obtained in a reference ageing test step 400, conducted prior to the other steps. FIG. 5 represents a flowchart of the reference ageing test step 400.

A "reference ageing test" consists in adding an impedance measuring step 410b to an existing battery ageing test (measurement of variation of resistance and capacity, step 410a).

A series of measurements (A, step 410b) of the low-frequency impedance performed on the basis of the injection across the battery terminals of sinusoidal current perturbations makes it possible to determine the evolution of the LF impedance as a function of ageing.

In a step of identifying a preliminary model of the test battery (step 430), a second series of measurements (B, step 431) makes it possible to reproduce raw telemetry data under real conditions of use of the battery. This makes it possible, in a step 432, to calibrate a preliminary structure model which converts the raw telemetry data of the battery into LF impedance.

The identified preliminary model, for the type of battery undergoing a reference ageing test, can then be applied to the real telemetry of the battery during use, in order to evaluate its low-frequency impedance under its normal conditions of use.

More precisely, during battery lifetime tests (cycling of the battery), the capacity and the internal resistance of the battery (or of one of the elements of the battery if the latter is composed of a set of identical elements) are measured regularly.

A regular impedance measurement in the low frequencies (0.05 Hz-1 Hz) is performed during this lifetime test.

The measurement of the low-frequency impedance is preferably performed during discharging to avoid perturbations due to the battery charge regulator, when the latter exists.

As has been said, the low-frequency impedance measurements are composed of two separate measurements:

Step 410b: obtaining of the measurements A (sinusoidal perturbations).

On the basis of many sinusoidal perturbations, the magnitude and the phase of the low-frequency impedance of the battery are determined between 0.05 Hz and 1 Hz. The acquisition of the current and the voltage of the battery must preferably take place in the discharge phase (for example: 10 minutes after the beginning of the discharge).

Step 431: obtaining of the measurements B (simulation of a current representing real conditions of use).

A battery current typical of real conditions of use is injected into the battery used for the "ageing reference test" to simulate a real battery use profile. The storage of the current and the voltage of the battery must occur in the discharge phase (for example: ten minutes after the beginning of the discharge). A few minutes of acquisition are necessary (for example: ten minutes of acquisition). Given that the impedance of the battery must preferably be known from 0.05 Hz to 1 Hz (for the case of a Lithium-Ion type battery), the voltage and the current of the battery can be sampled at an optimal frequency of 10 Hz. On the basis of the identification of an existing model, the voltage and current telemetry is post-processed and the low-frequency impedance of the test battery is deduced.

During the reference test 400, the measurements A make it possible to obtain, in a step 420, a map of the evolution of the low-frequency impedance as a function of the ageing (for example a set of Nyquist curves as a function of the ageing). The measurements of the capacity and the internal resistance allow the calibration of each measurement A in terms of ageing.

Figure 6:
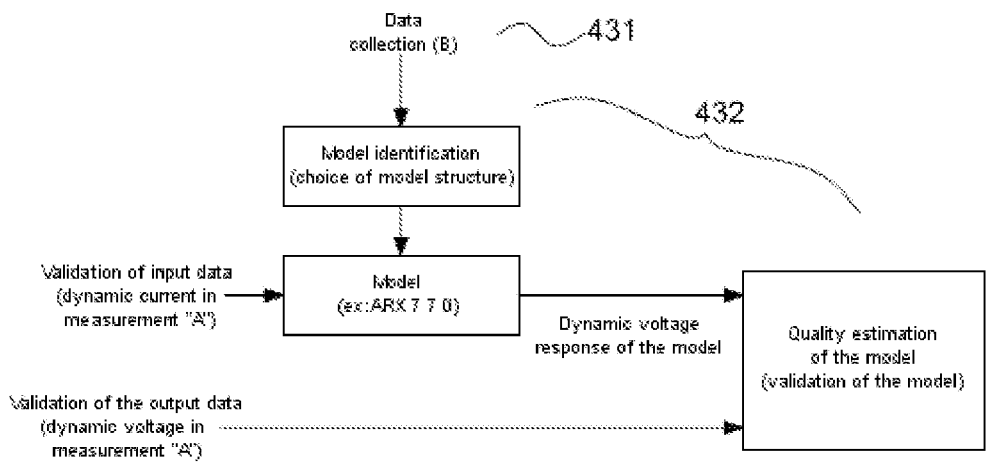
FIG. 6: a more detailed flowchart of the steps of identifying and validating an impedance model.

The series of measurements B (simulation of a current representing real conditions of use) makes it possible to identify in step 430 a preliminary model structure (a compromise between several model structures). As illustrated in FIG. 6, which represents a flowchart of a detail of the step 430, the measurement data B are used in the model identification process and the data from the measurement A are used to validate and estimate the quality of the model.

The aim of the model structures used is to model a time-discrete system as a linear combination of past input, output and perturbation data. We will consider here by way of non-limiting example a model structure for the modeling of a battery. Other model structures could also be used, without modifying the implementation of the method.

ARX Model Structure (Auto Regressive Model with eXternal Inputs)

In the case of the modeling of a battery, u (input) represents the dynamic current of the battery, y (output) is the dynamic voltage of the battery, and e (white noise) represents the measurement perturbations.

Note that the dynamic voltage and dynamic current respectively correspond to the voltage and current of the battery without the direct current part.

This model is then written:

$$A(q)y(t)=B(q)u(t)+e(t) \qquad \text{(equation 1)}$$

With $$A(q)=1+a_1q^{-1}+\ldots+a_{Na}q^{-Na}$$

$$B(q)=b_1q^{-Nk}+\ldots+b_{Nb}q^{-Nk-Nb+1}$$

$$(1+a_1q^{-1}+\ldots+a_{Na}q^{-Na})y(t)=(b_1q^{-Nk}+\ldots+b_{Nb}q^{-Nk-Nb+1})u(t)+e(t)$$

Hence:

$$y(t)=-a_1y(t-1)-\ldots-a_{Na}y(t-Na)+b_1u(t-Nk)+\ldots+b_{Nb}u(t-Nk-Nb-1)+e(t)$$

For an ARX model structure (Na; Nb; Nk), the coefficients to be identified are: $a_1, \ldots a_{Na}, b_1, \ldots, b_{Nb}$ Nk representing the delay.

The steps of identification of a model are known per se and will therefore not be further detailed here.

The most adequate structure of the model, i.e. that which exhibits the best correlation for all the measurements in the life test (for example stability of the structure of the model with the ageing of the battery) can then be used for the post-processing of the raw telemetry under real conditions of use (step 200 of processing on the ground according to real telemetry).

The validation of the preliminary model is made on the basis of the measurements acquired in step 410 (measurement "A").

Figure 7:
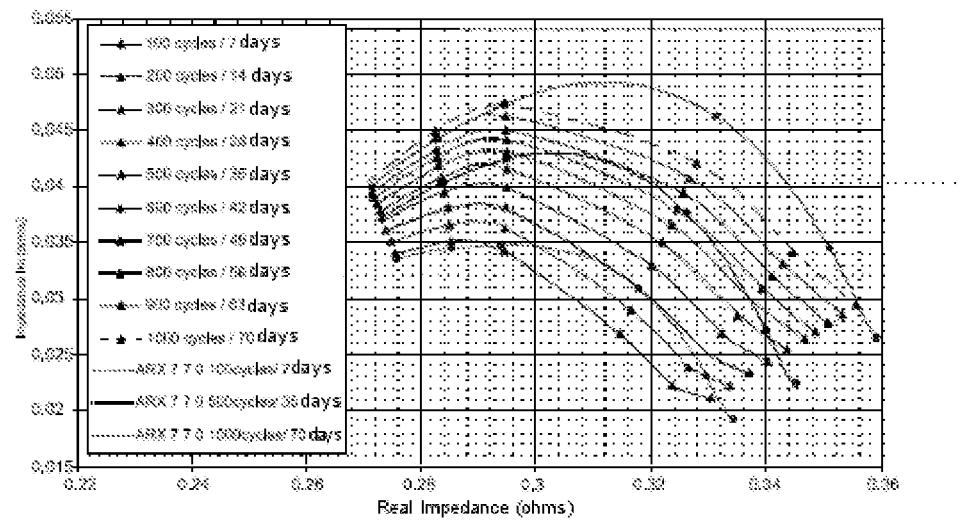
FIG. 7: a family of curves illustrating the comparison between the charts of low-frequency impedance measured on the ground on a test battery, and the LF impedance of the model structure identified for this battery.

FIG. 7 shows the comparison between a map of low-frequency impedance and the LF impedance of the identified preliminary model structure.

Note that each dotted line represents the low-frequency impedance of the battery, determined using the injection of sinusoidal perturbations at a frequency between 0.05 Hz and 1 Hz (measurement A).

The continuous lines represent the low-frequency impedance of the battery as determined from the raw current and voltage data (measurement B).

Figure 8:
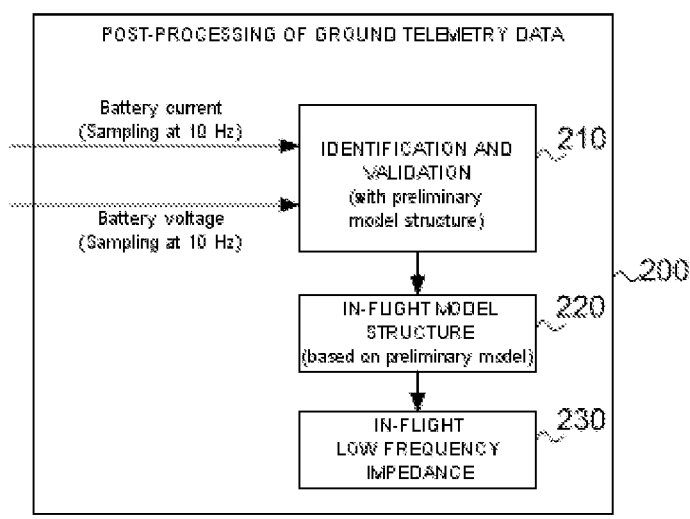
FIG. 8: a flowchart of a method for post-processing raw measurement data about the current and voltage across the battery terminals under real conditions of use.

From the measurements B, the low-frequency behavior of the test battery is modeled with great accuracy. In terms of ageing, a resolution of between 2 and 3 weeks is possible, as shown in FIG. 8 (corresponding to approximately 0.5% of the loss of capacity).

Step 100: Acquisition of the Current and Voltage Data Under Real Conditions of Use These measurements are acquired at any time during the normal use of the battery. They preferably cover at least one discharge period of the battery.

The battery telemetry (current and voltage of the battery) must be sampled at a minimum rate of 10 Hz.

The temperature of the battery is preferably also measured, so as to be able to take account of a drift of the impedance with the operating temperature of the battery.

The rate of sampling of the temperature can be much slower than 10 Hz ($\frac{1}{16}$ Hz is easily sufficient).

The acquisition of the telemetry must preferably cover the discharge phase (for example: 10 minutes after the start of the discharge).

To perform the identification of the battery model (step 200), it is necessary to create a set of data composed of identification data and validation data. The data for identification and the data for checking must be different (for example current and voltage, in a similar manner to FIG. 6).

The collection of real data is advantageously chosen so as to minimize the variance error (for a long measurement sequence) and the bias error (several operating points). Thus, each group can comprise several acquisitions. The duration of each acquisition must be sufficient (for example several minutes). The sampling interval must be sufficient to observe the dynamic response between 0.05 Hz and 1 Hz. The optimal sampling rate has been determined to be at 10 Hz.

The collection of data can be performed over a short period (for example: in low terrestrial orbit, it can be composed of 1 acquisition (of a few minutes) over each orbit in the course of 1 day, to avoid having large variations in the ageing of the battery during this time horizon. (Indeed, in this case there is no observable ageing over one day.)

Step 200: Determination of the Low-Frequency Impedance of the Battery from Time-Based Voltage and Current Data In step 200, to determine the low-frequency impedance of the real battery, a model structure is identified using raw telemetry (current and voltage) in the time domain.

In a first sub-step (210) the model structure closest to the measured data is identified, according to a predetermined distance function, or based on the preliminary model structure identified in step 430. The specific coefficients to be applied in the structure of the preliminary model (determined in step 430) are identified using the set of data.

In a second sub-step (220), the identified model is converted into the frequency domain. Finally, in a third sub-step (230), the low-frequency impedance of the battery used under real conditions of use is computed.

FIG. 8 presents the method for post-processing the telemetry data on the ground.

Step 300: Evaluation of Battery Ageing

This estimate is performed as a function of the computed low-frequency impedance, by comparing said impedance with a previously stored model (for example in the form of charts) of evolution of this impedance with ageing.

A model of evolution of the low-frequency impedance of a battery of the type of the real battery to be studied, as a function of its ageing, can be obtained by any method.

In the present example the low-frequency impedance of the battery under real conditions (evaluated in the post-processing of the telemetry data on the ground) is compared with the map of the low-frequency impedance evolution as a function of the ageing (obtained from the reference ageing test).

Figure 9:
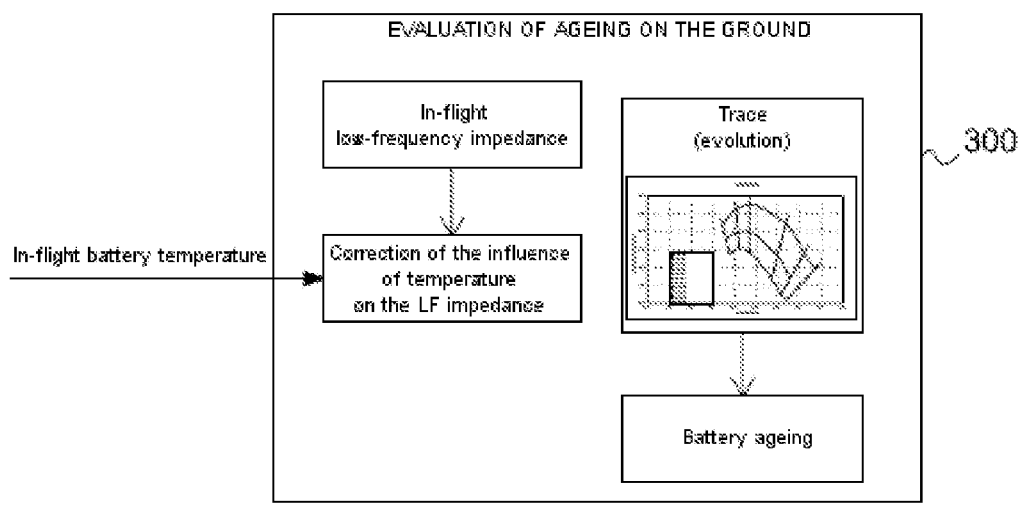
FIG. 9: a flowchart of the steps of estimating the age of the real battery under study.

Using the comparison of the low-frequency impedances, the ageing (loss of capacity/increase in internal resistance) is deduced (FIG. 9).

If the configuration of the battery in flight (number of accumulators in series and in parallel constituting the battery) differs from that used in the reference test, the impedance of the battery in flight and the charts showing the evolution of the impedance as a function of ageing will be deduced for a normalized configuration (for example for an accumulator, for the configuration of the battery under test or for the configuration of the battery in flight etc.), in order to be able to be compared directly.

If the temperature in flight is not the same as in the reference test, the estimation of the low-frequency impedance under real conditions will be corrected in order to take account of the effect of the temperature on the low-frequency impedance. This entails having previously determined, by any method, the laws of low-frequency impedance evolution as a function of temperature.

In a particular case of embodiment of the method, this correction is performed by:

1/ determining the laws of low-frequency impedance evolution with temperature during the reference test (The reference test is performed at a given temperature. At a given amount of ageing, the low-frequency impedance of the battery is measured for various temperatures of the range of use of the battery in flight. The evolution of the low-frequency impedance as a function of the temperature is measured for several levels of ageing during the reference test. Thus the laws of evolution of the LF impedance as a function of temperature are established).

2/ correction of the estimated impedance in flight from the laws of evolution with temperature to determine the normalized impedance of the battery in flight at the temperature of the reference test (as indicated on FIG. 10).

ADVANTAGES

In the prior art, the measurement described in the context of the patent application "Method for determining an aging condition of a battery cell by means of impedance spectroscopy" (mentioned above) is intrusive since it requires dedicated equipment making it possible to generate an excitation current in sines of variable frequencies. Due to this fact, the measurement of the low-frequency impedance is impossible when the system wherein the battery is embedded (satellite, car etc.) is in operation, because in this case the current of the battery is perturbed by the various consumption rates. Such a measurement would be possible only by stopping the system, which is impossible in the case of a satellite.

The method described here, based on a non-intrusive method for determining the low-frequency impedance, on the contrary makes it possible to perform a "direct" measurement, when the system wherein the battery is embedded is in normal operation. No perturbation is injected into the battery.

The described method enables the accuracy of an impedance spectroscopy method, without requiring equipment for injecting the signal across the battery terminals, and without in any way interfering with the progress of the system of which the battery is a part.

The invention claimed is:

1. A method for estimating the ageing of a Li-Ion type battery powering an electrical system, comprising:
   a reference ageing test to determine a model of evolution of the impedance of the Li-Ion type battery with ageing, the model based on measurements in a frequency interval 0.01-3 Hz and subsequently conducting:
   testing the Li-Ion type battery during a normal operation of the Li-Ion type battery throughout a life of the Li-Ion type battery;
   acquiring a set of data about the voltage and current across the battery terminals, in response to current perturbations provoked during the normal operation of the Li-Ion type battery by changes of consumption rate of the electrical system;
   determining an impedance of the Li-Ion type battery throughout the life of the Li-Ion type battery during the normal operation of the Li-Ion type battery, within a predetermined frequency interval, from the voltage and current data by:
      identifying parameters of a predetermined model structure from measured voltage and current data, the model structure configured to model a time-discrete battery as a linear combination of past input, output and perturbation data;
      converting the identified model into a frequency domain;
      computing a low-frequency impedance of the Li-Ion type battery; and
   determining an ageing profile of the Li-Ion type battery based on the impedance of the Li-Ion type battery determined from the voltage and current data obtained throughout the life of the Li-Ion type battery during the normal operation of the Li-Ion type battery to estimate an age of the Li-Ion type battery as a function of the impedance by comparing the impedance with a previously stored model of evolution of the impedance with ageing, the predetermined frequency interval being in 0.01-3 Hz band, and to determine an end of life of the electrical system.

2. The method as claimed in claim 1, further comprising storing the set of data when the electrical system is powered only by the Li-Ion type battery.

3. The method as claimed in claim 1, further comprising selecting the model structure from one of the following: ARMAX, ARX, Box Jenkins, or Output error.

4. The method as claimed in claim 1, further comprising correcting the computed low-frequency impedance to take account of a temperature of an environment of the Li-Ion type battery.

5. The method as claimed in claim 1, further comprising:
   measuring a magnitude and phase of the low-frequency impedance performed on a basis of an injection across the battery terminals of sinusoidal current perturbations to determine an evolution of an LF impedance as a function of ageing;
   identifying a preliminary model of the Li-Ion type battery;
   performing second series of measurements of the current and the voltage across the battery terminals to reproduce raw telemetry data under its normal conditions of use of the Li-Ion type battery; and
   calibrating a preliminary structure model which converts the raw telemetry data of the Li-Ion type battery into the LF impedance.

6. The method as claimed in claim 5, further comprising measuring the magnitude and phase of the low-frequency impedance at 0.05-1 Hz.

7. The method as claimed in claim 5, further comprising performing series of measurements of the current and the voltage across the battery terminals during battery lifetime tests.

8. The method as claimed in claim 1, further comprising performing the low-frequency impedance measurements during a discharge phase of the Li-Ion type battery.

9. The method as claimed in claim 1, further comprising sampling the voltage and the current of the LI-Ion type battery at a minimum frequency of 10 Hz.

10. The method as claimed in claim 1, further comprising acquiring measurements at any time during the normal operation of the Li-Ion type battery, the measurements covering at least one discharge period of the Li-Ion type battery.

11. A device for diagnosing the ageing of a Li-Ion type battery that stores a set of data about the voltage and current across the battery terminals, in response to current perturbations provoked during a normal operation of the Li-Ion type battery by changes of consumption rate of an electrical system; determines an impedance of the Li-Ion type battery throughout a life of the Li-Ion type battery during the normal operation of the Li-Ion type battery, within a predetermined frequency interval, from the voltage and current data by: (a) identifying parameters of a predetermined model structure from measured voltage and current data, the model structure configured to model a time-discrete system as a linear combination of past input, output and perturbation data, (b) converting the identified model into a frequency domain, and (c) computing a low-frequency impedance of the Li-Ion type battery; and estimates an age of the Li-Ion type battery as a function of the impedance by comparing the impedance with a previously stored model of evolution of the impedance with ageing, the predetermined frequency interval being in 0.01-3 Hz band.

12. A satellite comprising the device as claimed in claim 11.

* * * * *